US007586241B2

(12) United States Patent
Kuroda et al.

(10) Patent No.: US 7,586,241 B2
(45) Date of Patent: Sep. 8, 2009

(54) ELECTROACOUSTIC TRANSDUCER

(75) Inventors: Hideaki Kuroda, Imizu (JP); Yoshihiro Sonoda, Toyama (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 0 days.

(21) Appl. No.: 12/126,022

(22) Filed: May 23, 2008

(65) Prior Publication Data

US 2008/0218031 A1 Sep. 11, 2008

Related U.S. Application Data

(63) Continuation of application No. PCT/JP2006/315587, filed on Aug. 7, 2006.

(30) Foreign Application Priority Data

Nov. 24, 2005 (JP) ............................ 2005-339033

(51) Int. Cl.
*H01L 41/08* (2006.01)

(52) U.S. Cl. ........................ 310/348; 310/324; 310/310

(58) Field of Classification Search ................. 310/320, 310/321, 324, 330–332, 348, 353
See application file for complete search history.

(56) References Cited

U.S. PATENT DOCUMENTS

| | | | | |
|---|---|---|---|---|
| 3,509,387 | A * | 4/1970 | Thorn et al. | 310/324 |
| 3,939,467 | A * | 2/1976 | Cook et al. | 367/155 |
| 5,770,799 | A * | 6/1998 | Nakamura et al. | 73/514.34 |
| 7,109,641 | B2 * | 9/2006 | Park | 310/330 |
| 7,518,289 | B2 * | 4/2009 | Kobayashi et al. | 310/331 |

FOREIGN PATENT DOCUMENTS

| | | |
|---|---|---|
| JP | 55-107796 | 1/1954 |
| JP | 56-69795 | 10/1954 |
| JP | 57-45799 | 3/1982 |
| JP | 59-86998 | 5/1984 |
| JP | 59-144997 | 9/1984 |
| JP | 61-195698 | 8/1986 |
| JP | 55-137800 | 12/1986 |
| JP | 63-191800 | 12/1988 |
| JP | 64-48600 | 2/1989 |
| JP | 2-113799 | 4/1990 |
| JP | 3068450 | 2/2000 |
| JP | 2001-119793 | 4/2001 |
| JP | 2005-311415 | 11/2005 |
| JP | 2008-020701 A * | 1/2008 |

OTHER PUBLICATIONS

PCT/JP2006/315587 International Search Report dated Oct. 3, 2006.
PCT/JP2006/315587 Written Opinion dated Oct. 3, 2006.

* cited by examiner

*Primary Examiner*—Thomas M Dougherty
(74) *Attorney, Agent, or Firm*—Dickstein Shapiro LLP

(57) ABSTRACT

An electroacoustic transducer having one end portion of a first piezoelectric element and one end portion of a second piezoelectric element fixed to a frame such that the first piezoelectric element and the second piezoelectric element are supported by the frame in an opening of the frame in the cantilever manner. A flexible thin film is bonded to the frame and the first and second piezoelectric elements so that it covers at least a gap between each of the piezoelectric elements and the frame. The other end portions of the piezoelectric elements are free end portions, and face each other with a gap therebetween.

13 Claims, 8 Drawing Sheets

(a)

(b)

ELECTROACOUSTIC TRANSDUCER

CROSS REFERENCE TO RELATED APPLICATIONS

The present application is a continuation of International Application No. PCT/JP2006/315587, filed Aug. 7, 2006, which claims priority to Japanese Patent Application No. JP2005-339033, filed Nov. 24, 2005, the entire contents of each of these applications being incorporated herein by reference in their entirety.

FIELD OF THE INVENTION

The present invention relates to electroacoustic transducers used as sounders such as speakers, and, more particularly, to an electroacoustic transducer having a cantilever support structure in which a piezoelectric element is supported at one end portion thereof.

BACKGROUND OF THE INVENTION

In recent years, electroacoustic transducers such as a speaker and a buzzer using a piezoelectric effect are widely used. For example, the following Patent Document 1 discloses a sounder 101 illustrated in an elevational cross-sectional view in FIG. 11. The sounder 101 includes a box 102. One end portion of a piezoelectric vibrating element 103 is coupled to the inner wall of the box 102. The piezoelectric vibrating element 103 has a configuration in which electrodes 103*a* and 103*b* are provided on opposite surfaces of a piezoelectric ceramic plate. By applying an alternating electrical field to the piezoelectric ceramic plate from the electrodes 103*a* and 103*b*, the piezoelectric ceramic plate is polarized so that vibration thereof is excited.

In the sounder 101, the piezoelectric vibrating element 103 is supported at one end portion thereof, and the other end portion of the piezoelectric vibrating element 103 is a free end portion. That is, since the piezoelectric vibrating element 103 is supported in the cantilever manner, the free end portion of the piezoelectric vibrating element 103 can be significantly displaced. Accordingly, a high sound pressure can be obtained.

On the other hand, the following Patent Document 2 discloses a piezoelectric ceramic speaker illustrated in FIG. 12. In a piezoelectric ceramic speaker 111, one end portion of a piezoelectric vibrating element 113 is coupled to a frame member 112. The piezoelectric vibrating element 113 is supported at one end portion thereof in the cantilever manner, and the other end portion thereof is a free end portion. On the side of the free end portion, the center of a cone-shaped diaphragm 114 is fixed to the piezoelectric vibrating element 113. Accordingly, at the time of bending vibration of the piezoelectric vibrating element 113, the cone-shaped diaphragm 114 coupled to the free end portion of the piezoelectric vibrating element 113 vibrates. As a result, a high sound pressure can be obtained.

Patent Document 1: Japanese Unexamined Utility Model Application Publication No. 63-191800

Patent Document 2: Japanese Utility Model Registration No. 3068450

In the sounder 101, the peripheral portion of the piezoelectric vibrating element 103 excluding the portion coupled to the box 102 is exposed in the box 102. Accordingly, when the piezoelectric vibrating element 103 vibrates, the air pressure on the side of one surface of the piezoelectric vibrating element 103 and the air pressure on the side of the other surface of the piezoelectric vibrating element 103 cancel each other. As a result, sound in a low frequency range cannot be obtained. That is, a high sound pressure cannot be obtained over a wide range of frequencies.

On the other hand, in the piezoelectric ceramic speaker 111 disclosed in Patent Document 2, the cone-shaped diaphragm 114 capable of directly acting on the air generates an acoustic wave. Accordingly, in addition to the piezoelectric vibrating element 113, the large cone-shaped diaphragm 114 is required. As a result, the piezoelectric ceramic speaker 111 becomes larger in size. This makes it difficult to reduce the thickness of the piezoelectric ceramic speaker 111. Furthermore, the number of components is increased, and the number of manufacturing processes is therefore increased. This leads to the increase in cost.

Furthermore, natural in-plane vibration of the cone-shaped diaphragm 114 occurs. As a result, a frequency characteristic becomes deteriorated. Still furthermore, although the piezoelectric vibrating element 113 is supported at one end portion thereof in the cantilever manner, the free end portion thereof is coupled to the cone-shaped diaphragm 114. Accordingly, there is a vibration mode in which the free end portion of the piezoelectric vibrating element 113 is hardly displaced. As a result, a sharp dip occurs in a frequency characteristic.

SUMMARY OF THE INVENTION

It is an object of the present invention to provide an electroacoustic transducer capable of obtaining a high sound pressure over a comparatively wide range of frequencies with certainty and coming down in size, in particular, in thickness without increasing the number of components and the number of manufacturing processes.

According to the present invention, there is provided an electroacoustic transducer including a frame having an opening, a plurality of piezoelectric elements each placed in the opening of the frame and each having one end portion coupled to the frame, and a flexible thin film that is bonded to the frame and the piezoelectric elements so as to cover at least a gap between the frame and each of the piezoelectric elements in the opening of the frame. The other end portions opposite to the end portions of the piezoelectric elements are free end portions, and face each other across a gap in the opening of the frame.

In an aspect of an electroacoustic transducer according to the present invention, the flexible thin film is placed so that it covers an entire area of the opening of the frame, and an entire area of one of main surfaces of each of the piezoelectric elements is bonded to the flexible thin film.

In another aspect of an electroacoustic transducer according to the present invention, the piezoelectric elements each has a substantially trapezoidal shape having an upper base and a lower base corresponding to the end portion coupled to the frame.

In still another aspect of an electroacoustic transducer according to the present invention, a length of the end portion of each of the piezoelectric elements which is coupled to the frame is smaller than a width of the opening at the gap across which the piezoelectric elements face each other. The width of the opening is a dimension in the same direction as a direction of the length of the end portion.

In still another aspect of an electroacoustic transducer according to the present invention, a rigid plate that is bonded to the flexible thin film at the gap across which the piezoelectric elements face each other and has a higher rigidity than that of the flexible thin film is further included.

In still another aspect of an electroacoustic transducer according to the present invention, a resonance frequency in a fundamental mode of at least one of the piezoelectric elements is different from that of the other piezoelectric elements.

In still another aspect of an electroacoustic transducer according to the present invention, a planer shape of at least one of the piezoelectric elements is different from that of the other piezoelectric elements.

In still another aspect of an electroacoustic transducer according to the present invention, a thickness of at least one of the piezoelectric elements is different from that of the other piezoelectric elements.

In still another aspect of an electroacoustic transducer according to the present invention, the frame and the piezoelectric elements are integrally formed using a single piezoelectric ceramic plate.

In an electroacoustic transducer according to the present invention, each of a plurality of piezoelectric elements is coupled to a frame at one end portion thereof. The other end portion of each of the piezoelectric elements is a free end portion. Thus, the piezoelectric elements are supported in the cantilever manner. Accordingly, the free end portions of the piezoelectric elements can be significantly displaced. A flexible thin film is bonded to the frame and the piezoelectric elements so that it covers at least a gap between each of the piezoelectric elements and the frame. Accordingly, the flexible thin film bonded to the piezoelectric elements capable of being significantly displaced can also be significantly displaced. Consequently, a very high sound pressure can be obtained.

By simply bonding the piezoelectric elements and the flexible thin film to the frame, the miniaturization of an electroacoustic transducer, in particular, the reduction in thickness of the electroacoustic transducer can be easily achieved. Furthermore, the increase in the number of components can be prevented, and the electroacoustic transducer can be easily assembled. This leads to cost reduction.

If the flexible thin film is placed so that it covers the entire area of the frame and the entire area of one of main surfaces of each of piezoelectric elements is bonded to the flexible thin film, the flexible thin film can be bonded to the frame so that it covers the entire area of the opening of the frame and the piezoelectric elements can be easily bonded to the flexible thin film. Accordingly, the electroacoustic transducer can be more easily manufactured, and a more inexpensive electroacoustic transducer can be provided.

If the piezoelectric elements each has a substantially trapezoidal shape having an upper base and a lower base corresponding to the end portion coupled to the frame, the free end portion corresponding to the upper base can be more easily displaced. Accordingly, a higher sound pressure can be obtained.

If the length of the end portion of each of the piezoelectric elements which is coupled to the frame is smaller than a width of the opening at the gap across which the piezoelectric elements face each other (the width of the opening is a dimension in the same direction as the length direction of the end portion), the piezoelectric elements can be easily displaced on the side of the gap across which the piezoelectric elements face each other. Accordingly, a higher sound pressure can be obtained.

If a rigid plate is bonded to the flexible thin film at the gap across which the piezoelectric elements face each other, the portion of the flexible thin film at the gap in which the rigid plate is disposed is displaced. As a result, a higher sound pressure can be obtained.

If a resonance frequency in a fundamental mode of at least one of the piezoelectric elements is different from that of the other piezoelectric elements, a high sound pressure can be obtained over a wider range of frequencies. If a planer shape of at least one of the piezoelectric elements is different from that of the other piezoelectric elements, a resonance frequency in a fundamental mode of the piezoelectric element can be easily made different from that of the other piezoelectric elements. If a thickness of at least one of the piezoelectric elements is different from that of the other piezoelectric elements, a resonance frequency in a fundamental mode of the piezoelectric element can be similarly easily made different from that of the other piezoelectric elements.

If the frame and the piezoelectric elements are integrally formed using a single piezoelectric ceramic plate, the number of components can be reduced and an electroacoustic transducer capable of easily coming down in size can be provided.

REFERENCE NUMERALS

Figure 1:
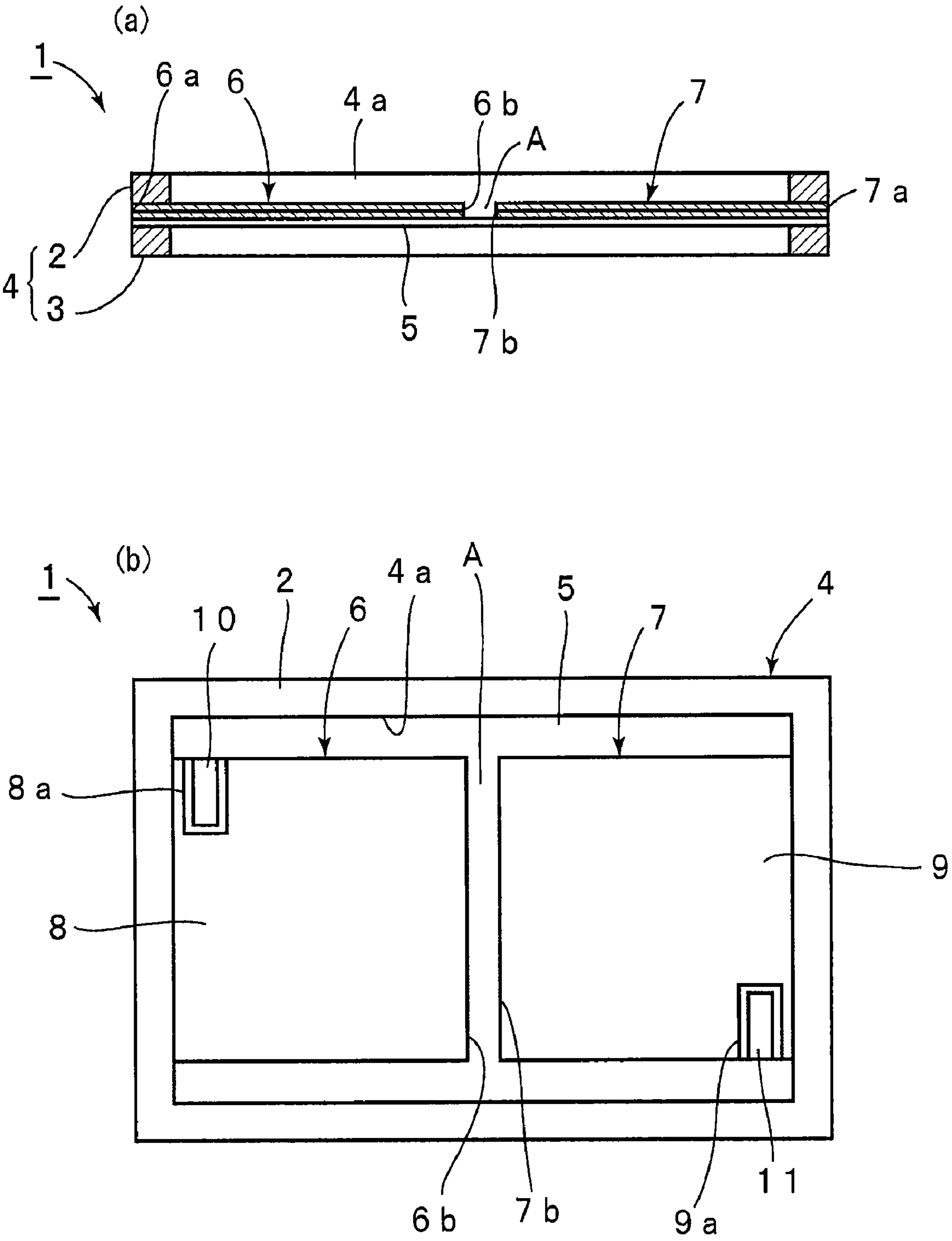
FIGS. 1(*a*) and 1(*b*) are an elevational cross-sectional view and a plan view of an electroacoustic transducer according to a first embodiment of the present invention, respectively.

1 electroacoustic transducer
2 frame member
3 frame member
4 frame
4*a* opening

5 flexible thin film
6 first piezoelectric element
6A and 7A piezoelectric element
6*a* and 7*a* end portion
6*b* and 7*b* end portion
7 second piezoelectric element
8 and 9 electrode film
8*a* and 9*a* notch
10 and 11 terminal electrode
12 electroacoustic transducer
13 electroacoustic transducer
21 electroacoustic transducer
22 rigid plate
31 electroacoustic transducer
32 to 35 first to fourth piezoelectric elements
36 rigid plate
41 electroacoustic transducer
43 and 43 piezoelectric element
51 electroacoustic transducer
52 and 53 first and second piezoelectric elements
71 piezoelectric ceramic plate
71*a* notch
71*b* and 71*c* side face
72 first piezoelectric element
73 second piezoelectric element
74 electrode film
75 internal electrode
A gap

DETAILED DESCRIPTION OF THE INVENTION

Embodiments of the present invention will be described in detail below with reference to the accompanying drawings.

FIGS. 1(*a*) and 1(*b*) are an elevational cross-sectional view and a plan view of an electroacoustic transducer according to a first embodiment of the present invention, respectively. An electroacoustic transducer 1 is suitable for use as a piezoelectric speaker. The electroacoustic transducer 1 includes a frame 4 obtained by bonding a first frame member 2 and a second frame member 3 together. The frame members 2 and 3 are made of an appropriate rigid material such as metal or ceramic. In this embodiment, the frame members 2 and 3 are made of metal.

The frame 4 includes an opening 4*a*. In the opening 4*a*, a flexible thin film 5 is bonded to the frame 4 so that it covers the entire area of the opening 4*a*. More specifically, the peripheral portion of the flexible thin film 5 is sandwiched and fixed between the frame members 2 and 3 so that the flexible thin film 5 covers the entire area of the opening 4*a*.

The flexible thin film 5 is composed of a flexible thin film made of a material that is not particularly limited, but is preferably a deformable and elastic material having a large internal loss and an excellent environmental resistance such as synthetic rubber having rubber elasticity, natural rubber, or elastomer. Examples of such synthetic rubber include ethylene-butadiene rubber and styrene-butadiene rubber.

The thickness of the flexible thin film 5 is not particularly limited, but, in this embodiment, ranges from 30 to 100 μm. The flexible thin film 5 is required to have a certain degree of flexibility that does not restrict displacement caused by the bending vibration of a piezoelectric element that will be described later.

Each of a first piezoelectric element 6 and a second piezoelectric element 7 is bonded to the upper surface of the flexible thin film 5. In this embodiment, each of the piezoelectric elements 6 and 7 is a laminated piezoelectric element obtained by forming piezoelectric ceramic layers made of piezoelectric ceramic such as lead zirconate titanate on opposite sides of a single internal electrode layer. On opposite main surfaces of this laminated piezoelectric element, electrode films are formed (not illustrated in FIG. 1(*a*)). Such a laminated piezoelectric element can be obtained using an internal electrode-ceramic integral firing technique, and is widely used in piezoelectric speakers or piezoelectric buzzers.

In this embodiment, the above-described internal electrode is made of an Ag—Pt alloy. The electrode films formed on the opposite main surfaces of the laminated piezoelectric element are formed by sputtering an Ni—Cu alloy. On the end face of the piezoelectric element 6, the internal electrode thereof and the electrode films thereof are electrically connected to each other. On the end face of the piezoelectric element 7, the internal electrode thereof and the electrode films thereof are electrically connected to each other. As illustrated in FIG. 1(*b*), a notch 8*a* is formed near one of corners of an electrode film 8 formed on the upper surface of the first piezoelectric element 6, and a notch 9*a* is formed near one of corners of an electrode film 9 formed on the upper surface of the second piezoelectric element 7. Terminal electrodes 10 and 11 are provided in the notches 8*a* and 9*a*, respectively. The terminal electrodes 10 and 11 extend to the end faces of the piezoelectric elements 6 and 7, respectively, and are individually electrically connected to the internal electrodes (not illustrated) on the end faces. By applying an AC voltage between the terminal electrode 10 and the electrode film 8 and between the terminal electrode 11 and the electrode film 9, the electroacoustic transducer 1 is driven. Each of the piezoelectric elements 6 and 7 includes two layers that are polarized the same direction of thickness.

One end portion 6*a* of the laminated piezoelectric element 6 and one end portion 7*a* of the laminated piezoelectric element 7 are fixed to the frame 4, whereby the laminated piezoelectric elements 6 and 7 are supported. More specifically, as illustrated in FIG. 1(*a*), the piezoelectric element 6 is sandwiched between the frame members 2 and 3 near the end portion 6*a* of the piezoelectric element 6 and the piezoelectric element 7 is sandwiched between the frame members 2 and 3 near the end portion 7*a* of the piezoelectric element 7, whereby the piezoelectric elements 6 and 7 are fixed. Accordingly, the other end portions 6*b* and 7*b* opposite to the end portions 6*a* and 7*a* of the piezoelectric elements 6 and 7 are free end portions. That is, the piezoelectric elements 6 and 7 are supported in the cantilever manner. Accordingly, the end portions 6*b* and 7*b*, which are free end portions, can be significantly displaced. The end portion 6*b* and the end portion 7*b* face each other with a gap therebetween.

Each of the piezoelectric elements 6 and 7 and the flexible thin film 5, which are sandwiched between the frame members 2 and 3, are bonded and fixed to each other using a known adhesive. Such an adhesive is not particularly limited. In this embodiment, however, a thermosetting silicon adhesive is used. Another adhesive such as an epoxy adhesive may be used. Alternatively, a hardening adhesive may be used instead of a thermosetting adhesive.

In the electroacoustic transducer 1 according to this embodiment, the piezoelectric elements 6 and 7 are used in such a manner that the bending vibrations of the piezoelectric elements 6 and 7 are in-phase with each other. Accordingly, the terminal electrodes 10 and 11 are connected to one potential, the electrode films 8 and 9 and the electrode films on the undersurfaces are connected to the other potential, and an alternating voltage is applied between the terminal electrode and the electrode film. As a result, the bending vibrations of the piezoelectric elements 6 and 7 are in-phase with each other, and the flexible thin film 5 vibrates in synchronization with the vibrations of the piezoelectric elements 6 and 7. Accordingly, sound is produced in accordance with the difference between the air pressure on the side of the upper surface of the flexible thin film 5 and the air pressure on the side of the undersurface of the flexible thin film 5.

In the electroacoustic transducer 1 that is manufactured as described previously, since the movement of the air between the side of the upper surface and the side of the undersurface of the flexible thin film 5 is interrupted, the difference between the air pressure on the side of the upper surface and the air pressure on the side of the undersurface is not canceled. Accordingly, a high sound pressure can be obtained over a wide range of frequencies. Furthermore, since the piezoelectric elements 6 and 7 are supported in the cantilever manner, the end portions 6*b* and 7*b* can be easily displaced. The flexible thin film 5 is therefore significantly displaced at a center position thereof at which the gap A is provided. Accordingly, a high sound pressure can be obtained.

Since the main part including the flexible thin film 5 and the piezoelectric elements 6 and 7 is obtained by simply bonding the piezoelectric elements 6 and 7 to the flexible thin film 5, these components are on the substantially same surface. Accordingly, the thickness can be reduced. Furthermore, since it is not required to couple a cone-shaped diaphragm to the piezoelectric elements 6 and 7, the number of components can be reduced and the manufacturing process can be simplified. Consequently, the cost of an electroacoustic transducer can be effectively reduced.

Since the piezoelectric elements 6 and 7 function as diaphragms, it is not required to take a natural vibration other than the natural vibrations of the piezoelectric elements 6 and 7 into consideration. Furthermore, since not only the displacements of the end portions 6*b* and 7*b* of the piezoelectric elements 6 and 7 but also the displacements of the entire surfaces of the piezoelectric elements 6 and 7 are used, a sharp dip cannot be easily occurred in a frequency characteristic. Accordingly, a flat and high sound pressure characteristic can be obtained over a wide range of frequencies.

In this embodiment, the flexible thin film 5 covers the entire area of the opening 4*a*, but may cover at least the gap between each of the piezoelectric elements 6 and 7 and the frame 4. That is, the peripheral portions of the piezoelectric elements 6 and 7 may be coupled to the flexible thin film 5. The entire area of one of the main surfaces of each of the piezoelectric elements 6 and 7 may not necessarily be bonded to the flexible thin film 5 as described previously. The number of piezoelectric layers included in each of the piezoelectric elements 6 and 7 is not limited to two. Each of the piezoelectric elements 6 and 7 may include a large number of piezoelectric layers, for example, three or four piezoelectric layers.

Figure 2:
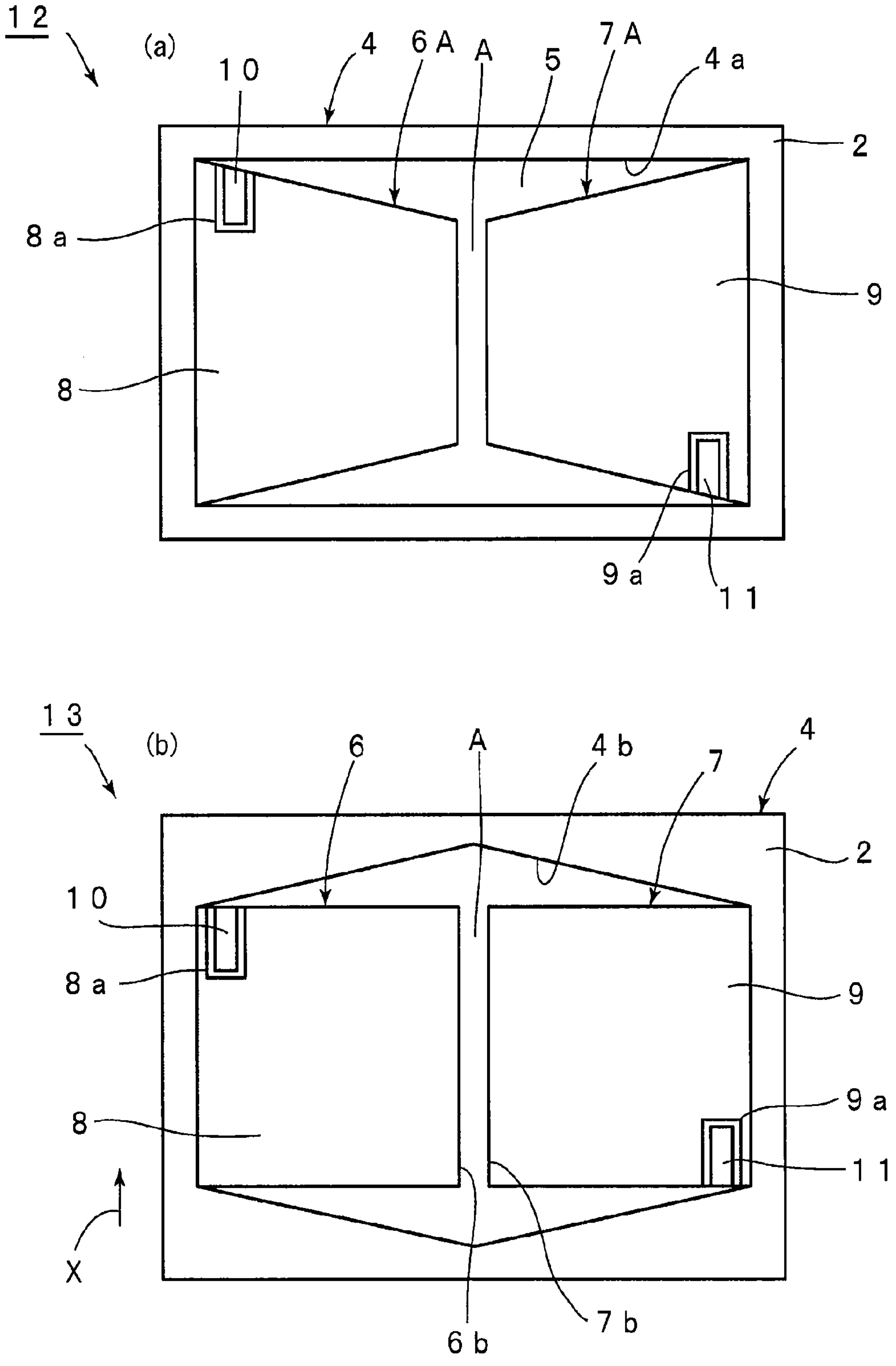
FIG. 2(*a*) is a plan view of an electroacoustic transducer according to an exemplary modification of the first embodiment of the present invention, and FIG. 2(*b*) is a plan view of an electroacoustic transducer according to another exemplary modification of the first embodiment of the present invention.

FIG. 2(*a*) is a plan view describing an exemplary modification of the electroacoustic transducer 1 according to this embodiment. In an electroacoustic transducer 12 according to this exemplary modification, each of piezoelectric elements 6A and 7A is composed of a trapezoidal piezoelectric ceramic plate having an upper base and a lower base whose length is larger than that of the upper base. That is, on the sides of the lower bases of the piezoelectric elements 6A and 7A, the piezoelectric elements 6A and 7A are supported by the frame 4, respectively. The upper bases of the piezoelectric elements 6A and 7A on the sides of tip portions thereof face each other with a gap therebetween. Except for this point, the electroacoustic transducer 12 has the same configuration as that of the electroacoustic transducer 1.

As described previously, the upper base whose width is smaller than that of the lower base is on the side of tip portion of each of the piezoelectric elements 6A and 7A. Accordingly, on the side of the upper base, a wide gap between each of the piezoelectric elements 6A and 7A and the frame 4 can be obtained. Each of the piezoelectric elements 6A and 7A can therefore be freely and significantly displaced. Accordingly, the electroacoustic transducer 12 can easily obtain a higher sound pressure than the electroacoustic transducer 1.

FIG. 2(*b*) is a plan view of another exemplary modification of the electroacoustic transducer 1. An electroacoustic transducer 13 according to another exemplary modification has the same configuration as that of the electroacoustic transducer 1 except that the shape of an opening 4*b* of the frame 4 is different from that of the opening 4*a* illustrated in FIG. 1(*b*). As illustrated in FIG. 2(*b*), the width of the opening 4*b* is increased on the sides of the end portions 6*b* and 7*b* of the piezoelectric elements 6 and 7. The width of the opening 4*b* is the dimension in the length direction of a portion of each of the piezoelectric elements 6 and 7 which is supported by the frame 4, that is, the dimension in a direction indicated by an arrow X illustrated in FIG. 2(*b*). In a portion in which the gap A is provided, the maximum width of the opening 4*b* is obtained. That is, the width of the opening 4*b* increases from each of the end portions of the piezoelectric elements 6 and 7 which are supported by the frame 4 to each of the end portions 6*b* and 7*b*. Accordingly, the length of the portion of each of the piezoelectric elements 6 and 7 which is coupled to the frame 4, that is, the width along the above-described X direction, is smaller than the width of the opening 4*b* at the gap A. Therefore, the end portions 6*b* and 7*b* of the piezoelectric elements 6 and 7 can be displaced faster than the end portions 6*b* and 7*b* included in the electroacoustic transducer 1. Like the electroacoustic transducer 12, the electroacoustic transducer 13 can easily obtain a higher sound pressure than the electroacoustic transducer 1 illustrated in FIG. 1.

From the viewpoint of capable of obtaining a high sound pressure, the electroacoustic transducers 12 and 13 are superior to the electroacoustic transducer 1 according to the first embodiment. However, in point of the simplification of a manufacturing process and the mechanical strength of the frame 4, the electroacoustic transducer 1 is superior to the electroacoustic transducers 12 and 13.

Figure 3:
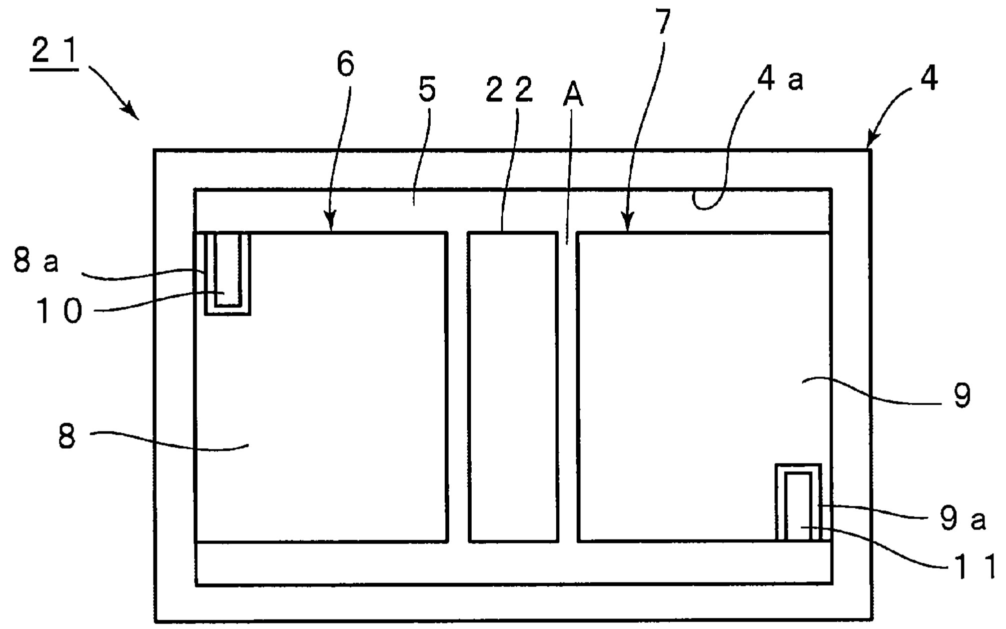
FIG. 3 is a plan view describing an electroacoustic transducer according to a second embodiment of the present invention.

FIG. 3 is a plan view of an electroacoustic transducer according to a second embodiment of the present invention. In an electroacoustic transducer 21, the piezoelectric elements 6 and 7 face each other with a gap therebetween in the opening 4*a* of the frame 4. At the gap A, a rigid plate 22 having a rigidity higher than that of the flexible thin film 5 is bonded to the flexible thin film 5. The rigid plate 22 can be made of an appropriate material having rigidity higher than that of the flexible thin film 5. In this embodiment, the rigid plate 22 is composed of a fiber reinforced plastic plate having a thickness that is substantially the same as that of the piezoelectric elements 6 and 7. The thickness of the rigid plate 22 is not necessarily substantially the same as that of the piezoelectric elements 6 and 7. It is desirable that the rigid plate 22 be made of the lightest material with high rigidity.

The rigid plate 22 is bonded to the flexible thin film 5. Accordingly, when the piezoelectric elements 6 and 7 are displaced, the rigid plate 22 is significantly displaced in a portion of the flexible thin film 5 in which the gap A is placed. As compared with a case in which only the flexible thin film 5 is displaced at the gap A, a higher sound pressure can be obtained since the rigid plate 22 is bonded to the flexible thin film 5. The reason for this is that the area in which vibration is performed with the maximum displacement is increased.

Figure 4:
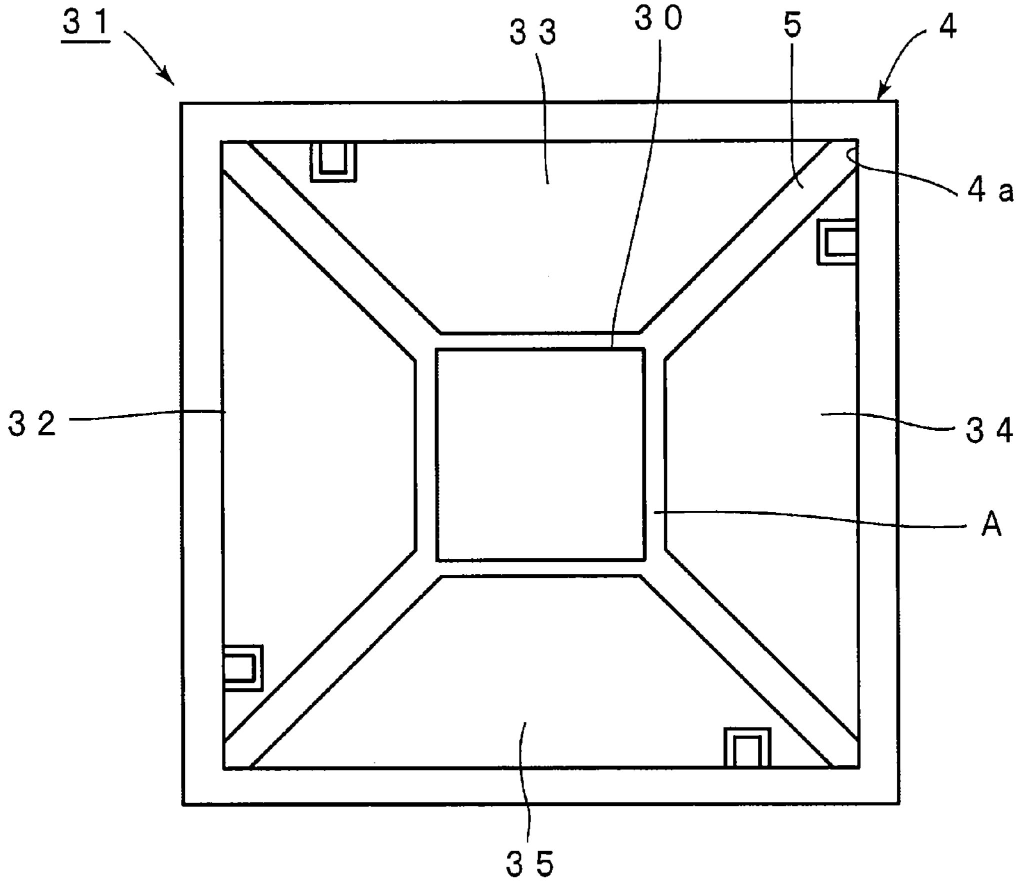
FIG. 4 is a plan view describing an electroacoustic transducer according to a third embodiment of the present invention.

FIG. 4 is a plan view of an electroacoustic transducer according to a third embodiment of the present invention. In an electroacoustic transducer 31, first to fourth piezoelectric elements 32 to 35 are provided in the opening 4*a* of the frame 4. More than two piezoelectric elements may be provided in the opening 4*a*.

Like the piezoelectric elements 6A and 7A used in the electroacoustic transducer 12, the piezoelectric elements 32 to 35 each has a substantially trapezoidal shape. Each of the piezoelectric elements 32 to 35 has an upper base at a tip portion thereof, and is fixed to the frame 4 at a lower base thereof. In this embodiment, the flexible thin film 5 is similarly fixed to the frame 4 so that it covers the entire area of the opening 4*a*. In a gap region A on the side of the tip portion of each of the piezoelectric elements 32 to 35 having a substantially trapezoidal shape, a rectangular rigid plate 30 is bonded to the flexible thin film 5. Accordingly, in this embodiment, using the rigid plate 30, the area in which vibration is performed with the maximum displacement can also be increased and a higher sound pressure can also be obtained.

Furthermore, in this embodiment, a larger number of piezoelectric elements (the piezoelectric elements 32 to 35) are provided. Accordingly, a larger or heavier rigid plate can be disposed. As a result, the level of sound pressure can be increased.

In FIG. 4, the piezoelectric elements 32 to 35 each having a substantially trapezoidal shape are provided. When more than two piezoelectric elements are disposed, however, the planer shape thereof is not limited to trapezoid, and may be various shapes such as rectangle and triangle.

Figure 5:
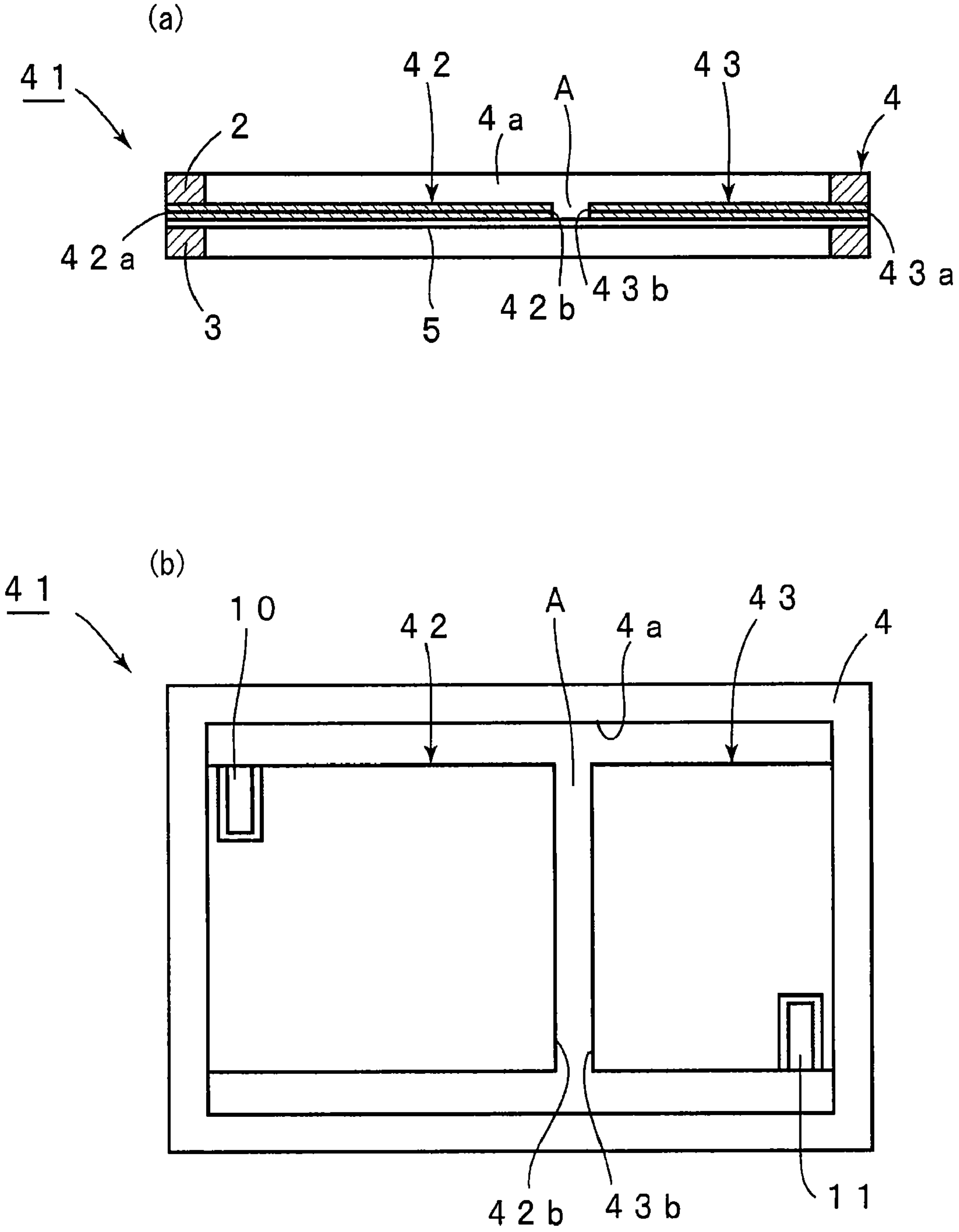
FIGS. 5(*a*) and 5(*b*) are an elevational cross-sectional view and a plan view describing an electroacoustic transducer according to a fourth embodiment of the present invention, respectively.

FIGS. 5(*a*) and 5(*b*) are an elevational cross-sectional view and a plan view describing an electroacoustic transducer according to a fourth embodiment of the present invention, respectively. In an electroacoustic transducer 41 according to this embodiment, a first piezoelectric element 42 and a second piezoelectric element 43 each having a planer rectangular shape are used. The piezoelectric elements 42 and 43 are fixed to the frame 4 at one end portions 42*a* and 43*a* thereof, respectively, and the other end portions 42*b* and 43*b* face each other with a gap therebetween. That is, the piezoelectric elements 42 and 43 are also supported in the cantilever manner.

The plane area of the first piezoelectric element 42 is different from that of the second piezoelectric element 43, and is larger than that of the second piezoelectric element 43. Except for this point, the electroacoustic transducer 41 has the same configuration as that of the electroacoustic transducer 1.

Since the area of the piezoelectric element 42 is larger than that of the piezoelectric element 43, the resonance frequency of the fundamental wave of the piezoelectric element 42 is different from that of the piezoelectric element 43. Accordingly, in this embodiment, a high sound pressure can be obtained over a wide range of frequencies.

The reason why a high sound pressure can be obtained over a wide range of frequencies when the resonance frequencies of the first piezoelectric element 42 and the second piezoelectric element 43 are different from each other will be described below.

Figure 6:
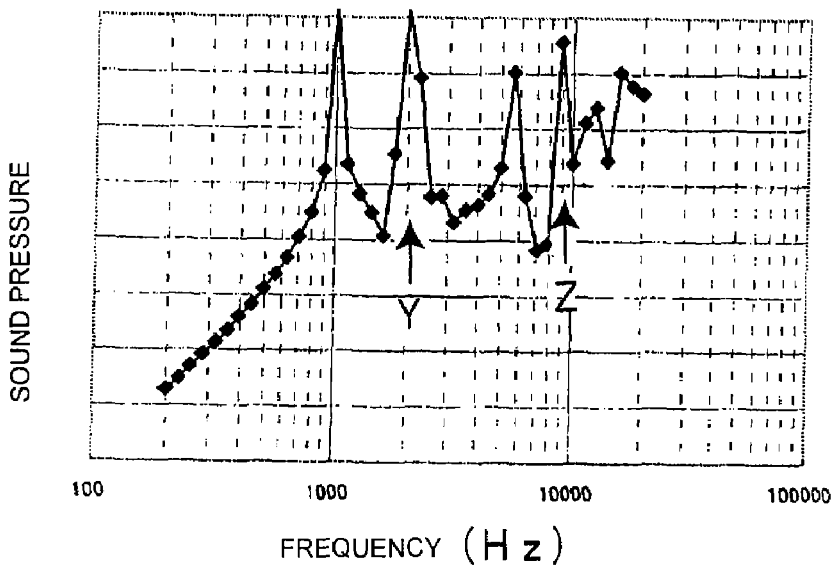
FIG. 6 is a schematic diagram illustrating a frequency characteristic of an electroacoustic transducer according to the fourth embodiment of the present invention.
Figure 7:
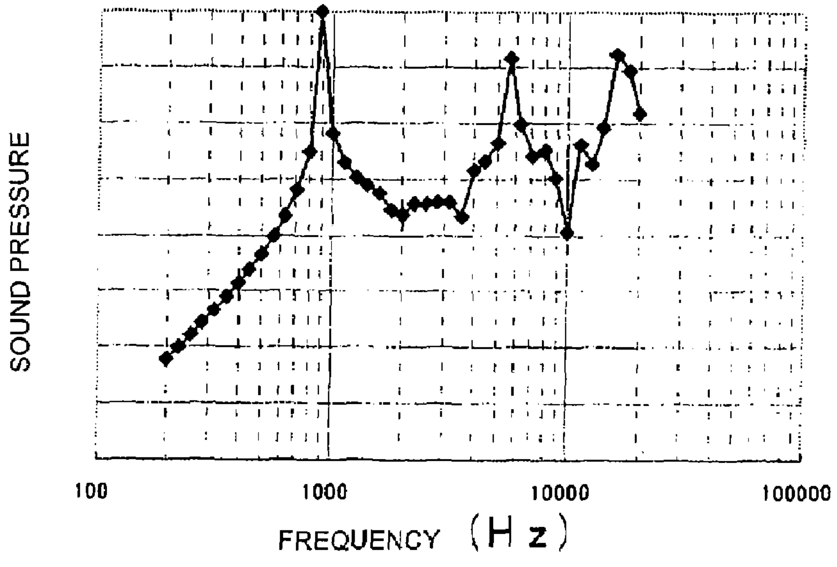
FIG. 7 is a schematic diagram illustrating a frequency characteristic of an electroacoustic transducer according to the first embodiment of the present invention.

FIG. 6 is a diagram illustrating a sound pressure-frequency characteristic of the electroacoustic transducer 41 in which the resonance points of the first piezoelectric element 42 and the second piezoelectric element 43 are different from each other. FIG. 7 is a diagram illustrating a sound pressure-frequency characteristic according to the first embodiment in which the resonance points of the first piezoelectric element 6 and the second piezoelectric element 7 are the same.

FIGS. 6 and 7 each illustrates the result of a simulation performed without consideration of loss. Accordingly, the waveform of the peak at each resonance point is sharp. In reality, however, the waveform of the peak at each resonance point is round.

The larger number of resonance points are illustrated in FIG. 6 as indicated by arrows Y and Z. Therefore, it can be understood that a high sound pressure can be obtained over a wide range of frequencies. In an electroacoustic transducer, a high sound pressure is obtained around a resonance point. Accordingly, if different resonance points are continuously obtained, a high sound pressure can be obtained over a wide range of frequencies.

Figure 8:
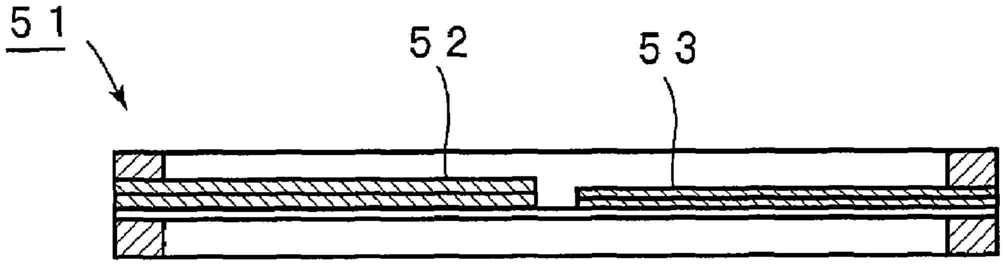
FIG. 8 is an elevational cross-sectional view describing an electroacoustic transducer according to a fifth embodiment of the present invention.

In the electroacoustic transducer 41 illustrated in FIGS. 5(*a*) and 5(*b*), the area of the first piezoelectric element 42 is different from that of the second piezoelectric element 43. On the other hand, in an electroacoustic transducer 51 illustrated in FIG. 8, the thickness of a piezoelectric element 52 is different from that of a second piezoelectric element 53. That is, as illustrated in a cross-sectional view in FIG. 8, the thickness of a piezoelectric ceramic plate of the first piezoelectric element 52 is larger than that of a piezoelectric ceramic plate of the second piezoelectric element 53. Accordingly, like the electroacoustic transducer 41, the resonance frequency of a fundamental wave generated by vibration of the first piezoelectric element 52 is different from the resonance frequency of a fundamental wave generated by vibration of the second piezoelectric element 53 in the electroacoustic transducer 51. In the electroacoustic transducer 51, a high sound pressure can also be obtained over a wide range of frequencies.

Figure 9:
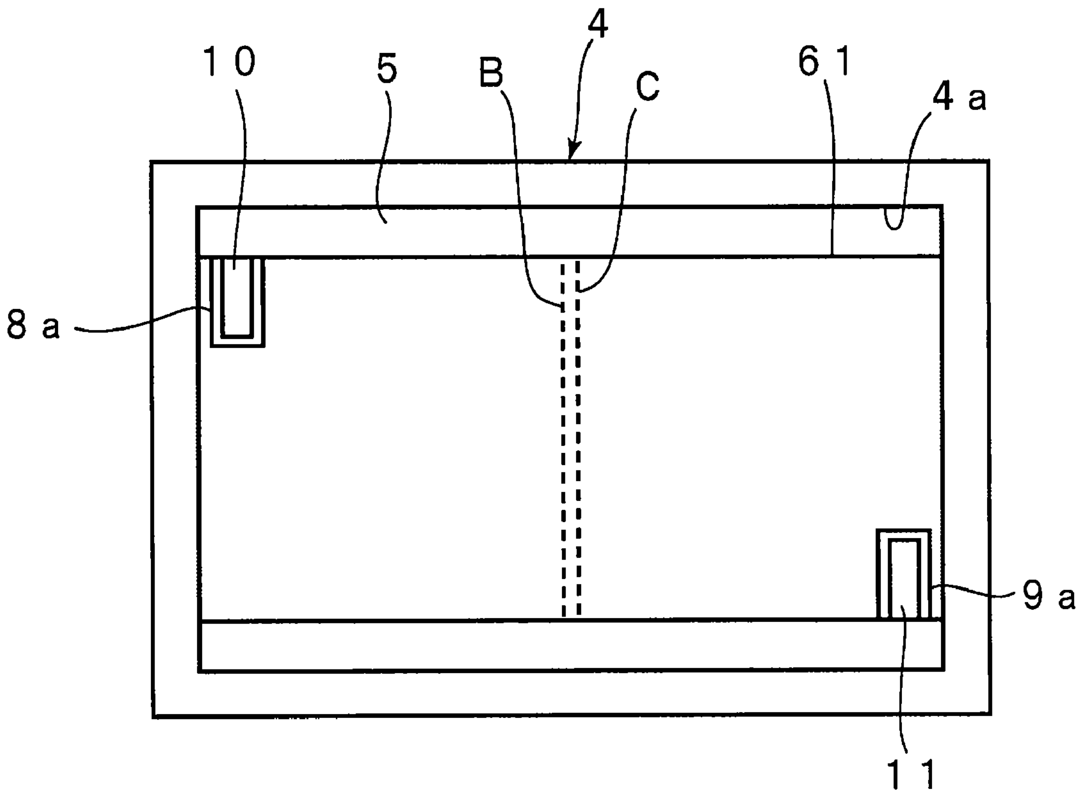
FIG. 9 is a schematic plan view describing an exemplary manufacturing method of an electroacoustic transducer according to the first embodiment of the present invention.

Although the manufacturing method of the electroacoustic transducers 1, 21, 31, 41, and 51 is not particularly limited, a method of fixing a single piezoelectric element and cutting the fixed piezoelectric element is preferably used. That is, as illustrated in a plan view in FIG. 9, by cutting a rectangular piezoelectric element 61 fixed to the frame 4 along broken lines B and C using a laser or mechanically cutting the piezoelectric element 61 fixed to the frame 4 along the broken lines B and C using a dicing machine, the piezoelectric elements 6 and 7 illustrated in FIG. 1 can be obtained. In this case, the flexible thin film 5 is fixed to the frame 4 in advance. Accordingly, the above-described cutting of the piezoelectric element 61 is performed without cutting the flexible thin film 5.

In the case of the above-described method of fixing the piezoelectric element 61 and then cutting the piezoelectric element 61, only a single piezoelectric element is required so as to obtain the electroacoustic transducer 1. Accordingly, the manufacturing process can be simplified. In a case where a piezoelectric element is fixed to the frame 4 and is then cut, misalignment of the piezoelectric elements 6 and 7 rarely occurs as compared with a case where two piezoelectric elements are prepared in advance. Accordingly, the accuracy of an electroacoustic transducer including a plurality of piezoelectric elements can be increased.

Figure 10:
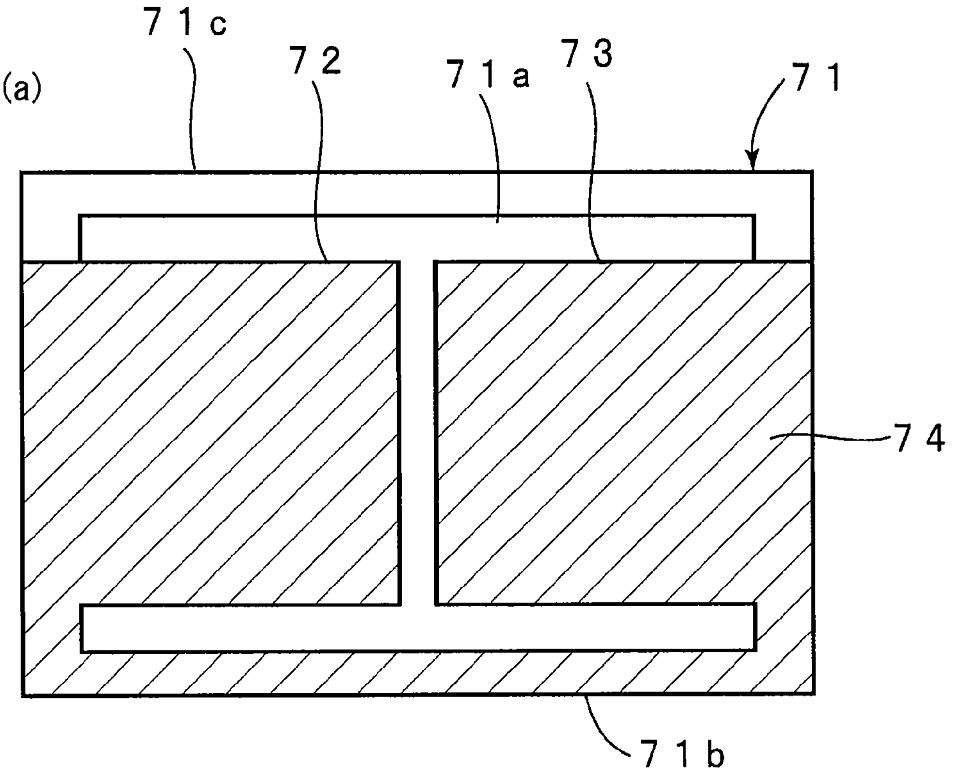
FIGS. 10(*a*) and 10(*b*) are a plan view and a plan cross-al sectional view describing an electroacoustic transducer according to still another exemplary modification of the first embodiment of the present invention, respectively.
Figure 10:
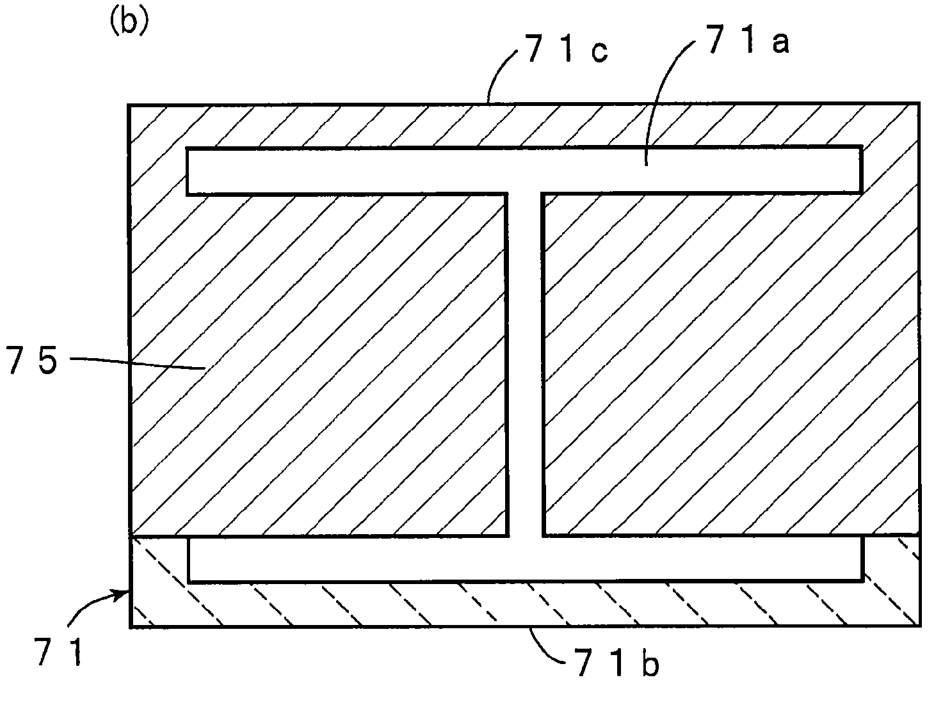
Figure 11:
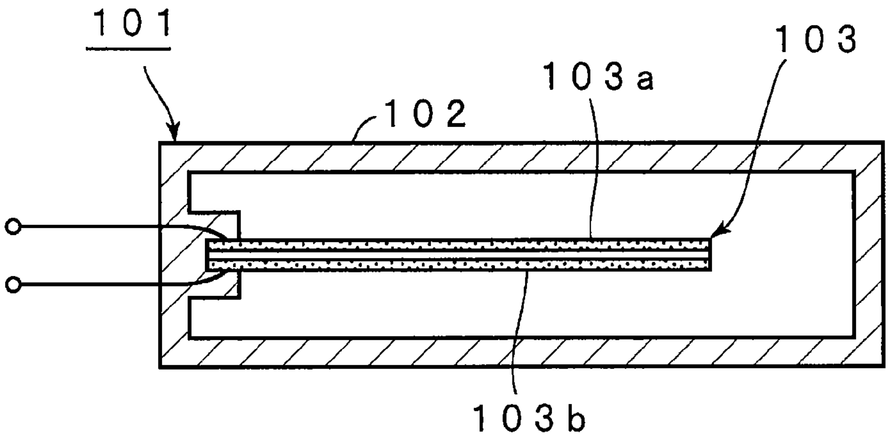
FIG. 11 is an elevational cross-sectional view describing a sounder that is an electroacoustic transducer in the related art.
Figure 12:
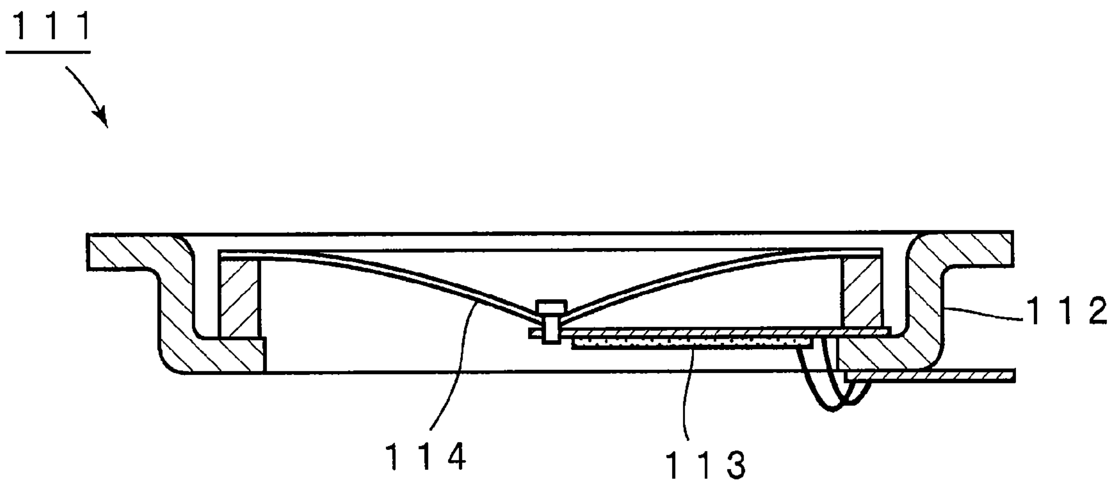
FIG. 12 is an elevational cross-sectional view describing a piezoelectric speaker that is an electroacoustic transducer in the related art.

In an electroacoustic transducer according to the present invention, a frame and piezoelectric element may be integrated using a piezoelectric ceramic plate. FIG. 10(*a*) is a plan view illustrating an electrode configuration of an electroacoustic transducer in which a frame and a piezoelectric element are integrated, and FIG. 10(*b*) is a plan cross-sectional view illustrating an internal electrode of the electroacoustic transducer.

As illustrated in FIG. 10(*a*), an H-shaped notch 71*a* is formed on a single ceramic plate 71, whereby a first piezoelectric element portion 72 and a second piezoelectric element portion 73 are formed. The notch 71*a* is formed using an appropriate method such as a laser cutting or dicing. Before the notch 71*a* is formed, an electrode film 74 is formed on the upper surface of the ceramic plate 71. The electrode film 74 extends from an edge of the ceramic plate 71 on the side of one side face 71*b* toward the other side face 71*c*, but does not extend to the other side face 71C.

On the undersurface of the ceramic plate 71, an electrode film is formed using the same method as that used for the formation of the electrode film 74. An internal electrode 75 illustrated in FIG. 10(*b*) is formed in the ceramic plate 71 in advance. The internal electrode 75 extends from the side face 71*c* toward the other side face 71*b*, but does not extend to the other side face 71*b*.

For connection to an external portion, the electrode film 74 and the electrode film formed on the undersurface of the ceramic plate 71 are electrically connected to each other and are then connected to the external portion on the side of the side face 71*b*. When electrically connecting the internal electrode 75 to an external portion, an external electrode is formed on the side of the other side face 71*c* and is then connected to the external portion. Accordingly, for example, electrical connection portions with an external portion can be integrated on the side of a supported portion of one of the first and second piezoelectric elements, and wiring of a lead wire can be simplified.

That is, in the electroacoustic transducer 1, an electrical connection portion with an external portion is provided in both of the first piezoelectric elements 6 and the second piezoelectric element 7. On the other hand, according to this embodiment, the electrical connection configuration can be simplified and design flexibility can be increased.

The invention claimed is:

1. An electroacoustic transducer comprising:

a frame having an opening;

a plurality of piezoelectric elements positioned in the opening of the frame, each of the plurality of piezoelectric elements having a first respective end portion thereof coupled to the frame and a second respective end portion opposite the first respective end portions, the second respective end portions being free end portions; and a flexible film bonded to the frame and the plurality of piezoelectric elements so as to cover at least a gap between the frame and each of the plurality of piezoelectric elements in the opening of the frame, wherein a resonance frequency in a fundamental mode of at least one of the plurality of piezoelectric elements is different from that of a second one of the plurality of piezoelectric elements.

2. The electroacoustic transducer according to claim 1, wherein the flexible film covers an entire area of the opening of the frame.

3. The electroacoustic transducer according to claim 1, wherein an entire area of a main surface of each of the plurality of piezoelectric elements is bonded to the flexible film.

4. The electroacoustic transducer according to claim 1, wherein the plurality of piezoelectric elements each has a substantially trapezoidal shape.

5. The electroacoustic transducer according to claim 1, wherein a width of the opening in the frame is greater at the second respective end portions of the plurality of piezoelectric elements than that that at the first respective end portions of the plurality of piezoelectric elements.

6. The electroacoustic transducer according to claim 1, further comprising a plate bonded to the flexible film between the plurality of piezoelectric elements.

7. The electroacoustic transducer according to claim 6, wherein the plate has a higher rigidity than that of the flexible film.

8. The electroacoustic transducer according to claim 7, wherein the plate has a thickness substantially the same as that of the flexible film.

9. The electroacoustic transducer according to claim 1, wherein a planer shape of at least one of the plurality of piezoelectric elements is different from that of a second one of the plurality of piezoelectric elements.

10. An electroacoustic transducer comprising:

a frame having an opening;

a plurality of piezoelectric elements positioned in the opening of the frame, each of the plurality of piezoelectric elements having a first respective end portion thereof coupled to the frame and a second respective end portion opposite the first respective end portions, the second respective end portions being free end portions; and a flexible film bonded to the frame and the plurality of piezoelectric elements so as to cover at least a gap between the frame and each of the plurality of piezoelectric elements in the opening of the frame, wherein a thickness of at least one of the plurality of piezoelectric elements is different from that of a second one of the plurality of piezoelectric elements.

11. An electroacoustic transducer comprising:

a frame having an opening;

a plurality of piezoelectric elements positioned in the opening of the frame, each of the plurality of piezoelectric elements having a first respective end portion thereof coupled to the frame and a second respective end portion opposite the first respective end portions, the second respective end portions being free end portions; and a flexible film bonded to the frame and the plurality of piezoelectric elements so as to cover at least a gap between the frame and each of the plurality of piezoelectric elements in the opening of the frame, wherein the frame and the plurality of piezoelectric elements are constructed from a single piezoelectric ceramic plate.

12. The electroacoustic transducer according to claim 1, wherein a thickness of the flexible film ranges from 30 to 100 μm.

13. The electroacoustic transducer according to claim 1, wherein bending vibrations of the plurality of piezoelectric elements are in-phase with each other.

* * * * *